United States Patent
Tsironis

(10) Patent No.: US 11,217,870 B1
(45) Date of Patent: Jan. 4, 2022

(54) DIGITAL LOAD PULL TUNER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 16/839,749

(22) Filed: Apr. 3, 2020

(51) Int. Cl.
*H01P 5/04* (2006.01)
*H03H 7/38* (2006.01)

(52) U.S. Cl.
CPC .................. *H01P 5/04* (2013.01); *H03H 7/38* (2013.01)

(58) Field of Classification Search
CPC ..................................... H03H 7/38; H01P 5/04
See application file for complete search history.

(56) References Cited

U.S. PATENT DOCUMENTS

| | | | |
|---|---|---|---|
| 5,276,411 A | 1/1994 | Woodin, Jr. et al. | |
| 7,282,926 B1 | 10/2007 | Verspecht et al. | |
| 9,660,607 B2* | 5/2017 | Boudiaf | G01R 27/28 |
| 9,921,253 B1 | 3/2018 | Tsironis | |
| 10,168,362 B1* | 1/2019 | Tsironis | G01R 17/02 |
| 10,187,228 B1* | 1/2019 | Tsironis | H03J 1/06 |
| 10,725,094 B1* | 7/2020 | Tsironis | G01R 31/2621 |
| 2013/0321092 A1 | 12/2013 | Simpson | |

OTHER PUBLICATIONS

Load Pull, [online] Wikipedia, [Retrieved on Nov. 18, 2016]. Retrieved from Internet <URL: https://en.wikipedia.org/wiki/Load_pull>.
"Computer Controlled Microwave Tuner, CCMT", Product Note 41, Focus Microwaves Inc. 1998, pp. 2-4.

* cited by examiner

*Primary Examiner* — Samuel S Outten

(57) ABSTRACT

A digital high-speed load pull tuner comprises a slide screw automatic tuner in a traditional reflection configuration and an active forward injection loop using a digital tuner in a transmission configuration. The forward active injection loop comprises two compact signal couplers of which at least one is adjustable, a digital tuner, circulator, feedback power amplifier; the passive tuner comprises one or more remotely controlled mobile carriages sliding along the slabline and carrying metallic tuning probes, used to create passive reflection factors. The incoming signal is sampled, modulated in amplitude and phase by the digital tuner and fed back into the slabline synchronizing with the passive reflected signal, to create a partially virtual load presented to the DUT.

4 Claims, 13 Drawing Sheets

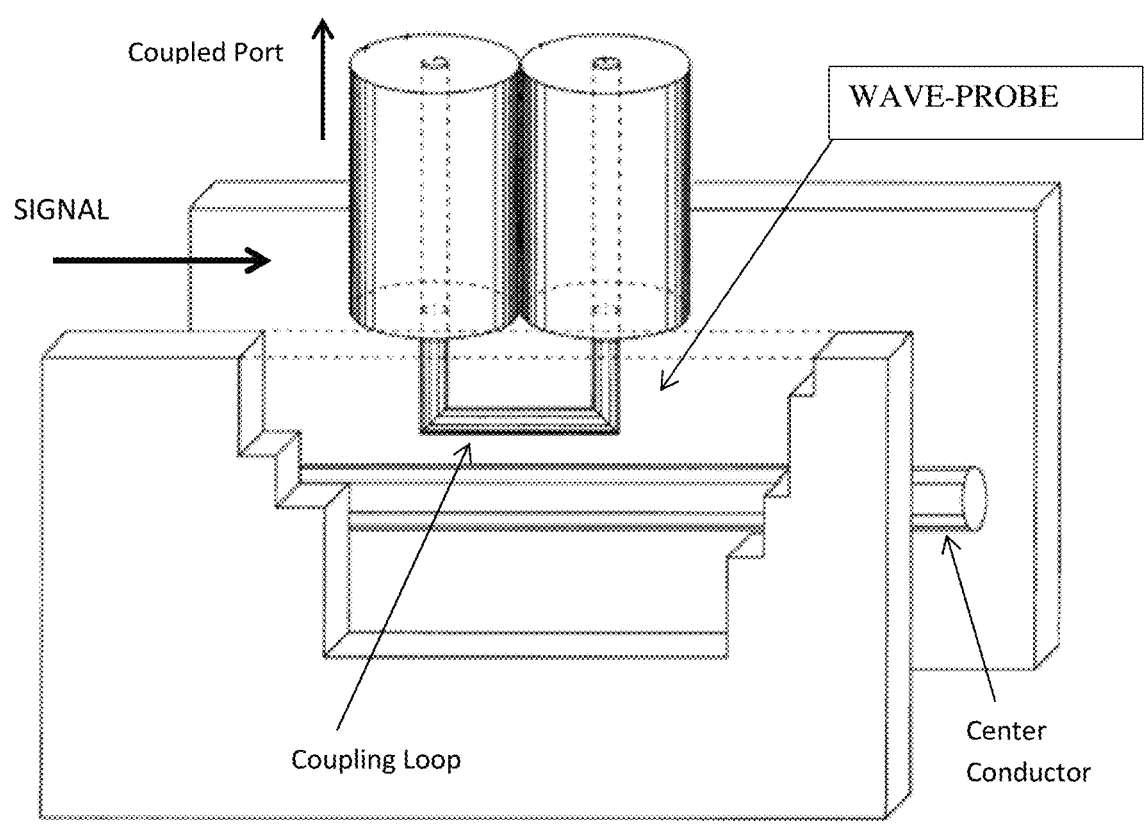
FIG. 12: Prior art

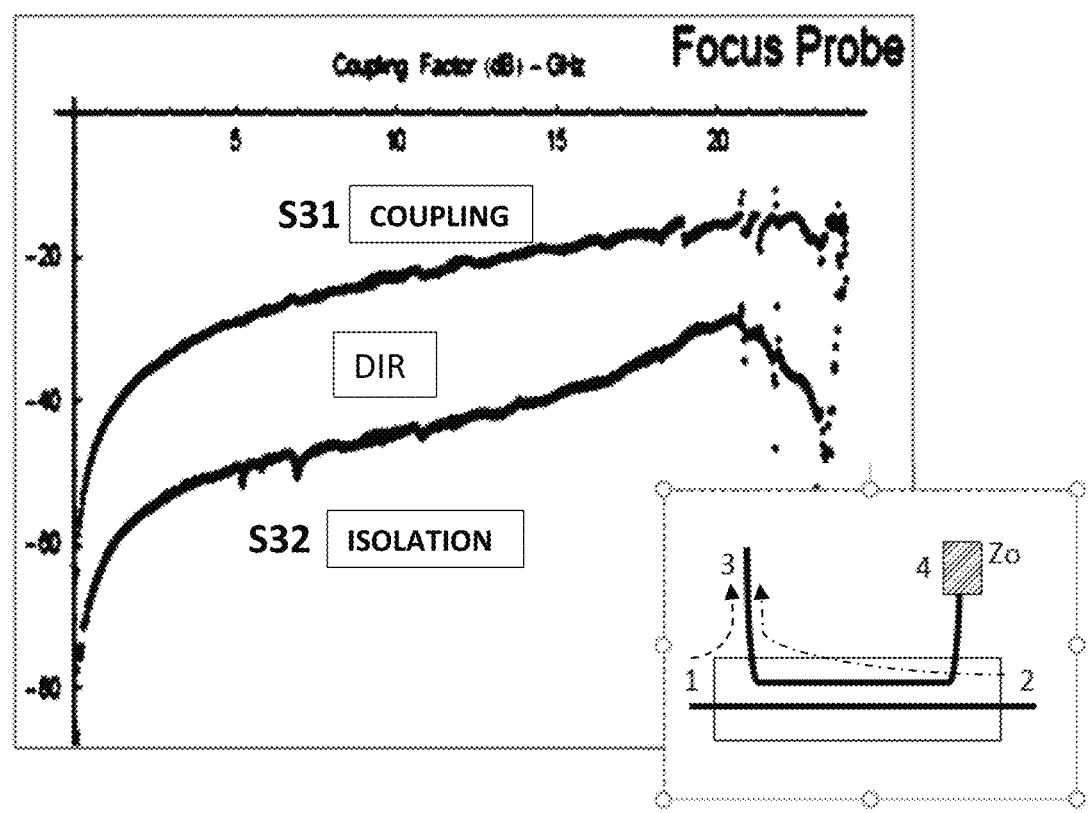
FIG. 13: Prior art

DIGITAL LOAD PULL TUNER

PRIORITY CLAIM

Not applicable

CROSS-REFERENCE TO RELATED ARTICLES

1. Load Pull, [online] Wikipedia, [Retrieved on 2016 Nov. 18]. Retrieved from Internet <URL: https://en.wikipedia.org/wiki/Load_pull>
2. "Computer Controlled Microwave Tuner, CCMT", Product Note 41, Focus Microwaves Inc. 1998, pages 2-4.
3. Verspecht et al. U.S. Pat. No. 7,282,926, "Method and an apparatus for characterizing a high-frequency device-under-test in a large signal impedance tuning environment".
4. Woodin Jr. et al., U.S. Pat. No. 5,276,411, "High power solid-state programmable load".
5. Simpson, G, US application Publication US 2013/0321092 A1, "Hybrid Active Tuning Systems and Methods", FIGS. 3, 6 and 9-22.
6. Tsironis, C. U.S. Pat. No. 9,921,253, "Method for reducing power requirements in active load pull system".

BACKGROUND OF THE INVENTION AND PRIOR ART

Introductory remark: Throughout this disclosure items on figures start with the number of the figure, for easier reading: Examples: item 55 is on FIG. 5; item 89 is on FIG. 8; item 112 is on FIG. 11; item 402 is on FIG. 4; item 202 is on FIG. 2 or 20 etc. . . . .

This invention relates to Non-50 Ohm load pull testing of microwave transistors (DUT) (see ref. 1). Load pull is the method by which the load impedance presented to the DUT at a given frequency and operating RF power is changed systematically and the DUT performance is registered, with the objective to find an optimum depending on the overall design objectives. This may be maximum gain, power, efficiency, linearity or else.

A traditional scalar load pull test system is shown in FIG. 1. It comprises a signal source, source and load impedance tuners, a device under test (DUT, transistor) in a test fixture (test fixture is also considered a wafer probe station giving access to a micro-chip on a semiconductor wafer using microscopic wafer probes) and input and output measurement instruments. The instruments can measure power, DC bias and various spectral components, generated either by the source or by the non-linearities of the DUT. The tuners and the instruments are controlled by a PC-controller using appropriate digital communication protocols (GPIB, RS 232, LAN etc.). The data acquired by the test software comprise RF and DC response of the DUT to input signal stimulus for given source and load impedances. This data is saved in load pull files and serve to (a) qualifying the DUT and (b) designing optimum RF matching networks for given target performance, this being output power, linearity, efficiency etc.

Embedding the DUT in fixtures and connecting with the tuners introduces insertion loss. This reduces the tuning range of the tuners, to the point that the DUT cannot be "matched", i.e. it cannot be presented physically the optimum load to obtain the target performance. Also, the hitherto used tuners (FIG. 1) are electro-mechanical slide screw tuners. Such tuner concept has survived over 40 years of technological progress because it offers extremely wideband response, can handle high power and is can be packaged as a product. Alternatively, in order to overcome the insertion loss, "active" tuner concepts have been introduced. Despite important efforts those active tuners lag bandwidth, power handling and universality. To increase power capability of active tuners requires very high power, expensive, amplifiers. Active tuner solutions still represent "configurable projects" rather than "universal products". An advantage of open loop active tuners, ("open loop" means the active tuners use external signal sources connected to the DUT output port, see ref. 5) is their high speed, because they are electronically controlled, whereas electro-mechanical tuners have mechanical moving parts and are therefore, in comparison, 100 to 1000 times slower (tuning speed in the range of milliseconds versus seconds). High speed closed loop active tuners have not been reported to date, because amplitude and phase control of the feedback re-injected signal requires slow amplitude and phase shifters (see ref. 5). An earlier development of digital solid-state (diode-based) high speed tuners (see ref. 4) has been abandoned by the market because of their limited linearity and tuning range, compared to electro-mechanical slide screw tuners (see ref. 4).

This invention discloses, other than any prior art (in particular FIGS. 4 and 5 in ref. 5), embodiments of load pull tuner combining the advantages of (a) high speed of closed loop digitally controlled active tuning, (b) high tuning range of closed loop active tuners and (c) active power savings and passive harmonic tuning of passive fixed pre-matching slide screw tuner (see ref. 6). Or, the invention bypasses all weaknesses of the existing methods, in a comprehensive synergy.

BRIEF SUMMARY OF THE INVENTION

The digital load pull tuner includes a closed-loop active tuner module and a remotely controlled passive pre-matching tuner module (FIG. 2, 3). A central slabline can be used to integrate the couplers of the closed-loop active tuner and the remotely controlled tuning probes of the passive tuner (FIG. 5). The two modules can also operate separately using two cascaded slablines, but complete integration inside the same slabline improves compactness and minimizes spurious reflections and insertion loss. The signal from the DUT is coupled into the closed loop of the active tuner, where it is digitally amplitude and phase modulated, amplified and coupled back into the slabline towards the DUT. The non-coupled portion of the signal from the DUT is reflected back at the passive tuner and the signal is super-imposed on the active loop signal, thus creating a modulated return signal into the DUT creating a combination of physical and virtual reflection factor (FIG. 5): $T=(<a2.phys>+<a2.virt>)/<b2>$, wherein $<b2>$ is the DUT outgoing signal, $<a2.phys>$ is the reflected signal at the remotely controlled passive tuner and $<a2.virt>$ is the feedback injected active signal. Only $<a2.virt>$ is digitally modulated and allows high speed tuning. $<a2.phys>$ allows directing (pre-matching) the load pull vector close to the optimum DUT matching load (FIG. 5, 8).

DETAILED DESCRIPTION OF THE DRAWINGS

The invention and its mode of operation will be more clearly understood from the following detailed description when read with the appended drawings in which:

FIG. 7A depicts tuning points of digital tuner; FIG. 7B depicts tuning points of remotely controlled electro-mechanical slide screw tuner.

FIG. 12 depicts prior art, the concept of the signal coupler "wave-probe".

FIG. 13 depicts prior art: port definitions and measured coupling, isolation and directivity of a wave-probe-type signal coupler.

DETAILED DESCRIPTION OF THE INVENTION

Figure 1:
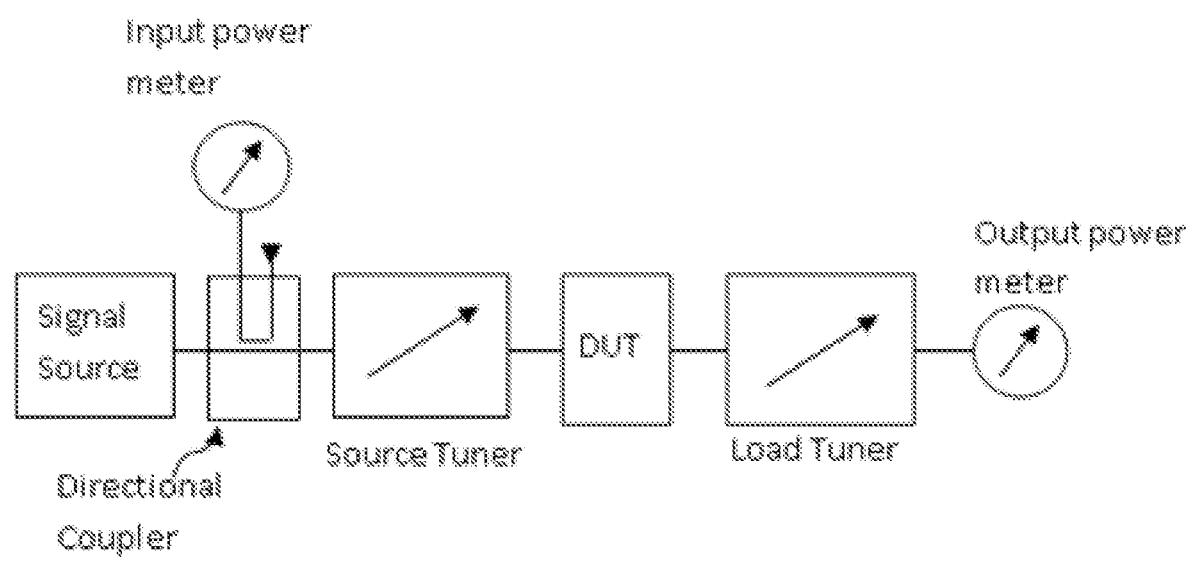
FIG. 1 depicts prior art, a typical "scalar" load pull test system.
Figure 2:
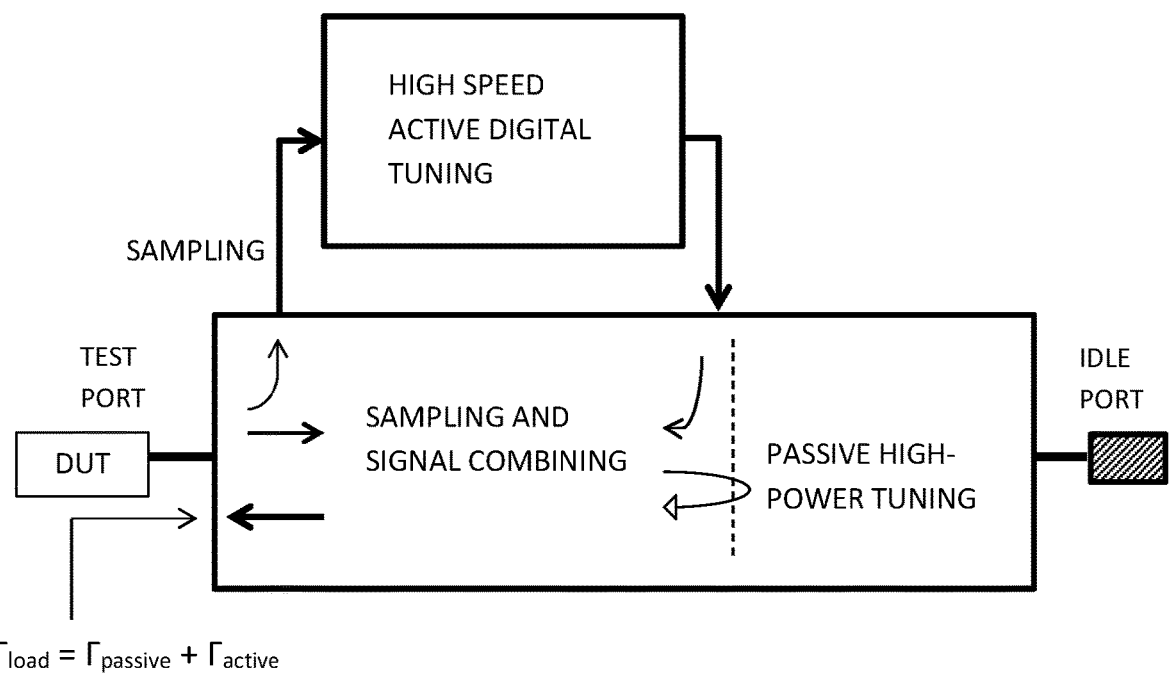
FIG. 2 depicts a first embodiment of the concept of the digital active/passive load pull tuner.
Figure 5:
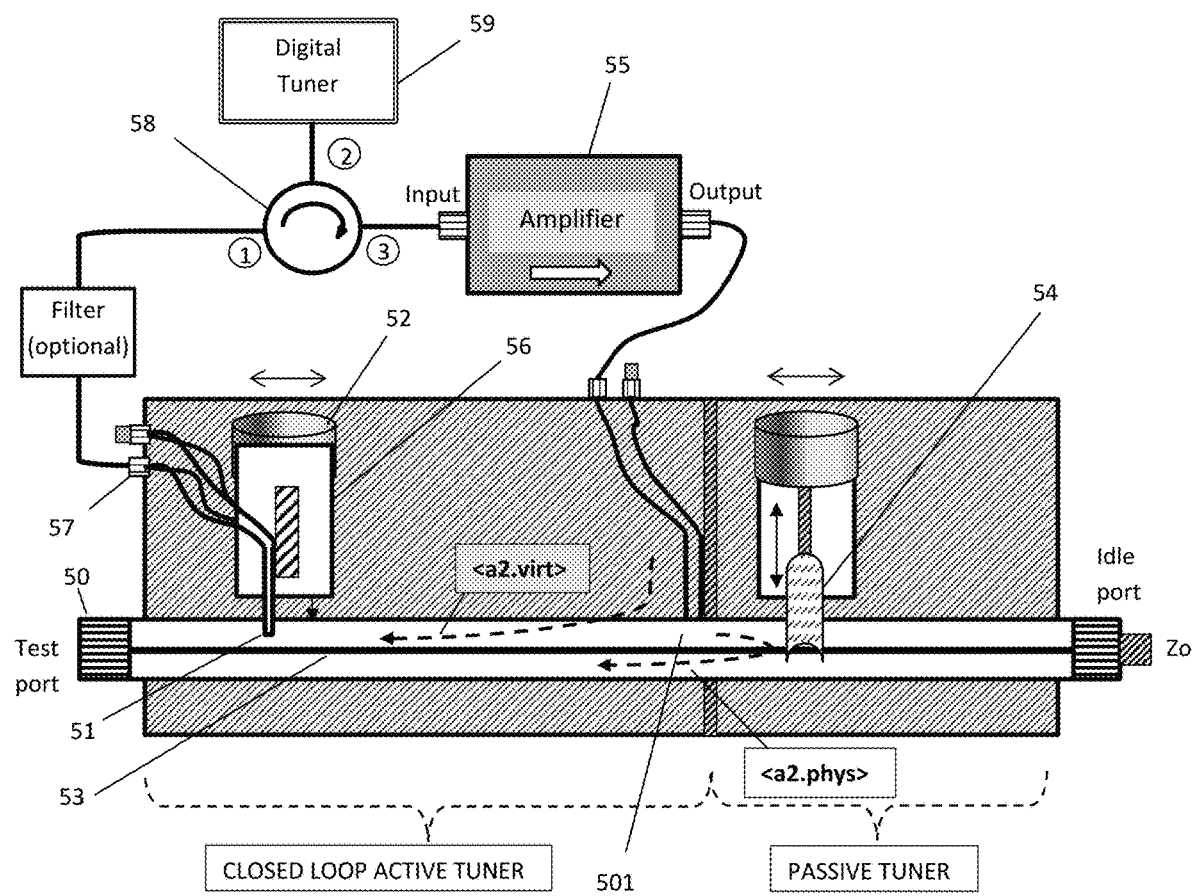
FIG. 5 depicts the detailed structure of the first embodiment of the digital load pull tuner (DLPT).
Figure 7A:
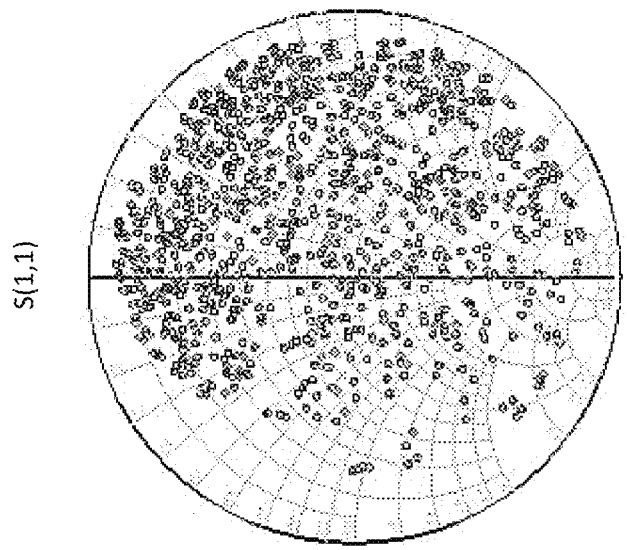
FIG. 7A through 7B depict prior art.

In a first embodiment of the invention (FIGS. 2 and 5) the signal exiting from the DUT output port enters the tuner into the test port (50); then it is sampled by the first adjustable coupler (51), FIG. 12, of which the coupling factor and phase are controlled by approaching its coupling loop (51) to the center conductor of the slabline (53) via the vertical axis (56) and motor (52) and its phase by changing the physical distance of the coupling loop (51) from the test port (50). The coupled signal portion propagates from port (57) through an optional filter to port 1 of circulator (58). From port 1 the signal is transferred with negligible insertion loss to port 2 where it is reflected back at the test port of the digital solid-state tuner (59). The multitude of reflection factors generated by the digital tuner is shown in FIG. 7A; this means the amplitude and phase of the reflected signal wave is digitally modulated by $\Gamma_{ET}=|\Gamma_{ET}|*\exp(j\Phi_{ET})$, as shown in FIG. 7A. The reflected signal is then, equally with very low insertion loss, transferred from port 2 to port 3 of the circulator, from there to the amplifier (55) and then through the fixed coupler (501) it is injected back into the slabline and returned to the DUT as the virtual part of the load <a2.virt>.

The remaining signal wave out of the DUT, after outcoupling a small portion first into the adjustable and subsequently into the fixed coupler, travels through to the remotely controlled passive tuner and is reflected at the metallic tuning probe (54). The passive tuner has at least one remotely controlled mobile carriage travelling along the slabline and each carriage has at least one remotely controlled vertical axis carrying a metallic reflective tuning probe insertable vertically into the slabline and capacitively coupled with the center conductor. The reflection factor here is $\Gamma_{PT}=|\delta_{PT}|*\exp(j\Phi_{PT})$ creating this way the returning physical reflected signal <a2.phys>, which overlaps with <a2.virt> to generate the hybrid (physical+virtual) load reflection factor $\Gamma_{LOAD}=(<a2.phys>+<a2.virt>)/<b2>$. By controlling amplitude and phase of the coupling factor of the adjustable coupler we can adjust the phase and the quantity of the feedback signal and through the reflection of the digital solid-state tuner we can create, at high speed, a multitude of <a2.virt> vectors to be added to a fixed <a2.phys> vector. This is demonstrated in FIG. 8; the reflection vector $\Gamma_{PT}$ directs the clouds $\Gamma_{DT}$ of digital tuning points (80), (81), (82), (83) in any direction around the Smith chart, whereas the coupling factor of the adjustable coupler determines its diameter and rotation angle. This last item (the phase is relevant, since the distribution of digital reflections is not homogenous over the Smith chart, FIG. 7A) in which case the rotation may direct a high-density area to cover the DUT optimum load.

Figure 6:
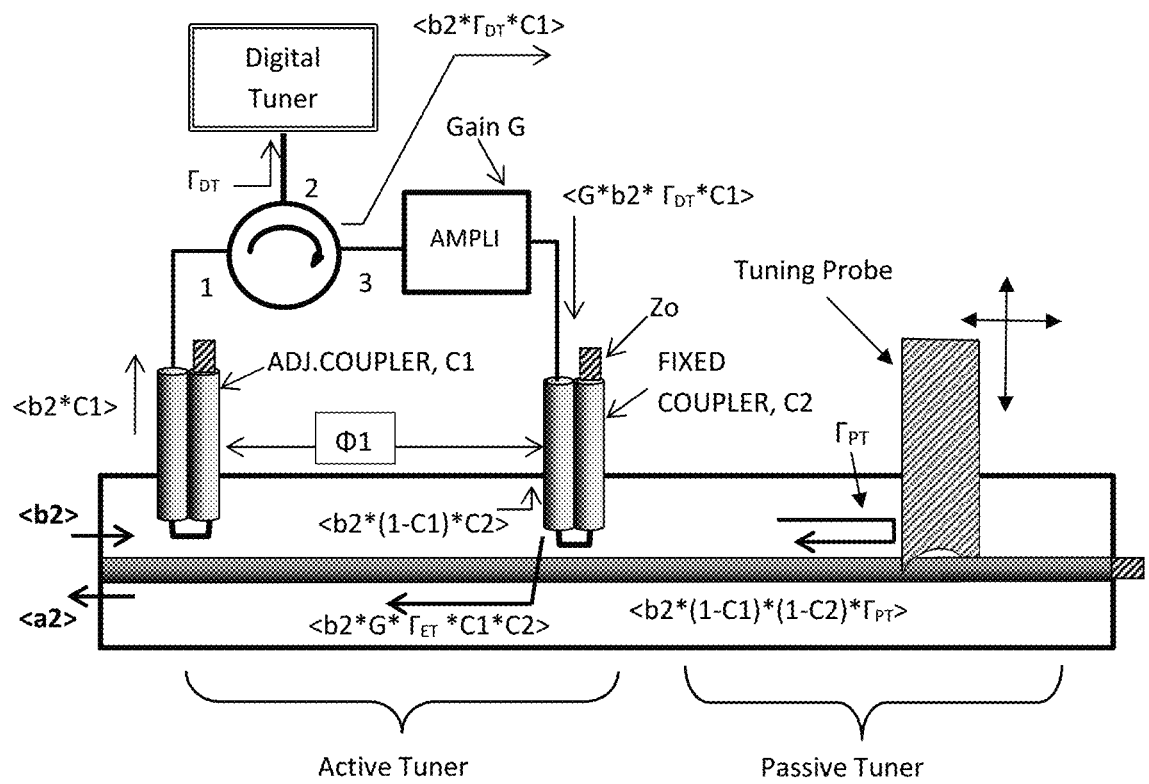
FIG. 6 depicts basic signal flow in first embodiment digital load pull tuner.

The actual signal propagation in the tuner is shown, in a simplified manner, in FIG. 6. From the entering signal <b2> a small portion <C1*b2> is sampled and injected into port 1 of the circulator. $C1=|C1|*\exp(j\Phi 1)$ is the coupling factor of the adjustable coupler (51). This signal portion is multiplied with the transmission factor of the circulator from port 1 to port 2: $S21\approx 1$ and is reflected by $\Gamma_{DT}$ at the test port of the digital solid-state tuner, creating the signal <$\delta_{DT}$*b2*C1> which is multiplied by the transmission factor $S32\approx 1$ of the circulator from port 2 to port 3 and delivered at port 3. From there, multiplied by the amplifier Gain G: (<G*$\Gamma_{ET}$*b2*C1>) it reaches the coupling port of the fixed coupler (501); hereby we assumed the transmission factors S21 and S32 of the circulator to be approximately 1 (in fact they typically vary between 0.9 and 0.98). Exact calculations are possible but will not change the scope of the invention. Subsequently this amplified and amplitude and phase modulated (tuned) signal is injected back into the slabline creating a total returning signal <G*$\Gamma_{DT}$*b2*C1*C2>, whereby C2 is the coupling factor of the fixed coupler (501). Meanwhile the remaining signal, from the DUT, after out-sampling through C1 and C2 i.e. <b2*(1−C1)*(1−C2)>, travels through the slabline and reaches the tuning probe of the passive tuner, where it is reflected by $\Gamma_{PT}$ and send back towards the DUT. This signal <b2*(1−C1)*(1−C2)*$\Gamma_{PT}$> is vector-added to create the total reflected signal <a2> yielding $$\Gamma_{load}=<a2>/<b>\approx G*\Gamma_{ET}*C1*C2-(1-C1)*(1-C2)*\Gamma_{PT}. \quad \{eq.1\}$$

To reach this simplified, though representative, relation we assumed the circulator to be ideal ($|S21|=|S32|=|S13|\approx 1$) and spurious couplings into the isolated ports of the couplers to be negligible. All this is not exactly true, but it can be neglected for the sake of simplicity. An exact calculation can be carried through but will not alter the scope of the invention. The relations are true and lead to useable results because the amplitudes and phases of the overlapping vectors are easily adjustable to maximum effect. What is important here is the capability of the system to adjust the returning signal by easily adjusting the coupling factor C1 and tune to the desired points using a combination of static passive tuning $\Gamma_{PT}$ and fast dynamic tuning $\Gamma_{DT}$. This, no hitherto solution can do as efficiently.

$\Gamma_{Load}$ can obviously be created for a number of combinations of $\Gamma_{DT}$ and $\Gamma_{PT}$ and can be adjusted to reach $|\Gamma_{Load}|=1$. Hereby $\Gamma_{PT}$ is the initially adjusted but then fixed pre-matching reflection vector of the passive tuner and $\Gamma_{DT}$ is the actual digital, high speed, tuning reflection factor. $\Gamma_{PT}$ is freely adjustable and is placed close to the optimum DUT load, but remains fixed during load pull, FIG. 8. $\Gamma_{DT}$ is the high speed (<1 ms per point) tuning matrix. FIG. 7A.

Figure 8:
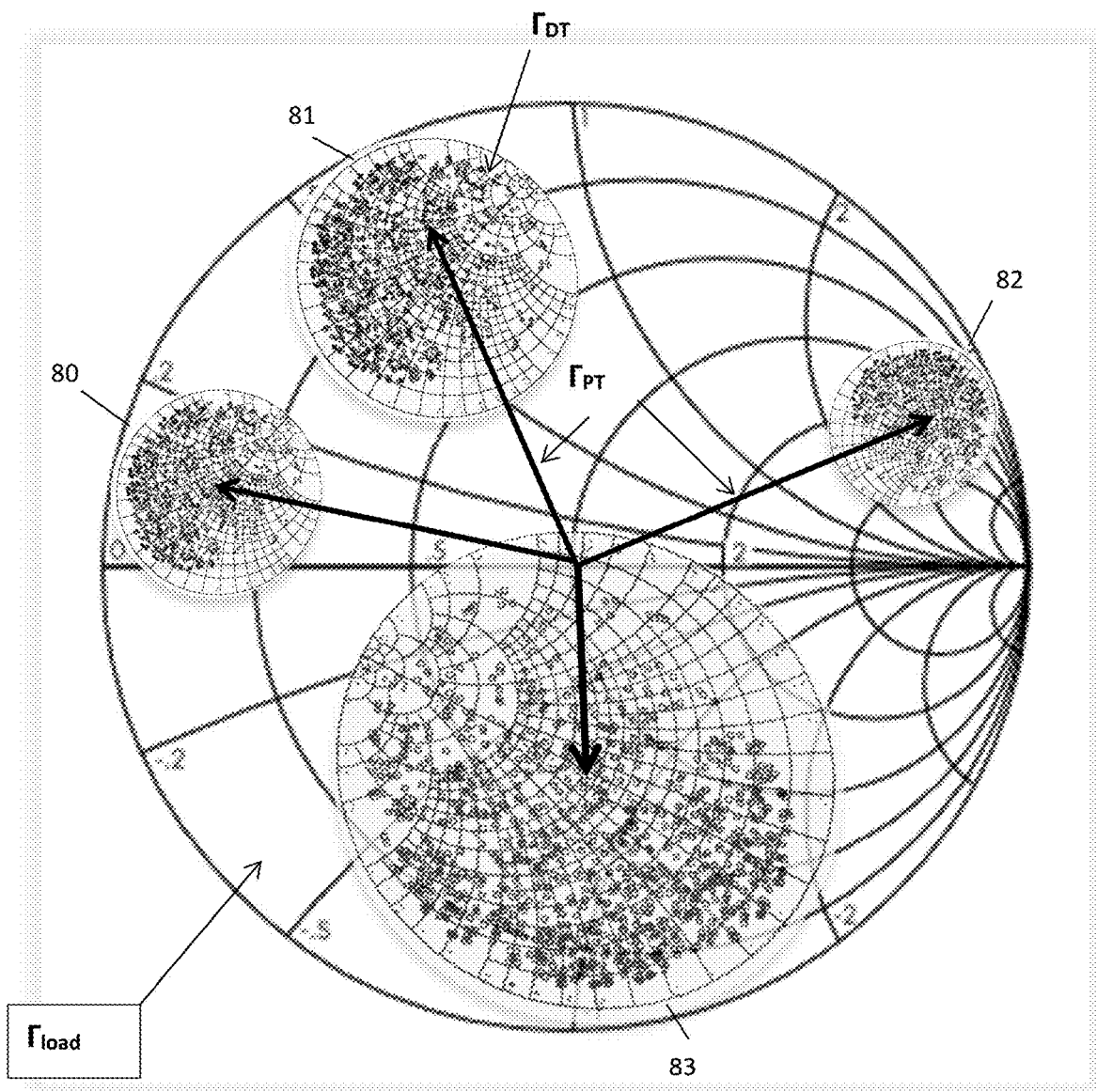
FIG. 8 depicts tuning scheme of digital load pull tuner (DLPT), including passive pre-matching and digital planetary circles for various coupler settings.

FIG. 8 shows the potential of the solution. The $\Gamma_{DT}$ tuning clouds show high speed digital tuning around quasi-static pre-matching (pre-tuned) vectors $\Gamma_{PT}$. Circle (80) shows medium C1*C2 and large $\Gamma_{PT}$. Circle (81) shows large C1*C2 and large $\Gamma_{PT}$. Circle (82) shows small C1*C2 and large $\Gamma_{PT}$. Circle (83) shows large C1*C2 and Gain (G) and small $\Gamma_{PT}$. It is obvious that system maneuverability is sufficient to cover any area of the Smith chart.

Figure 3:
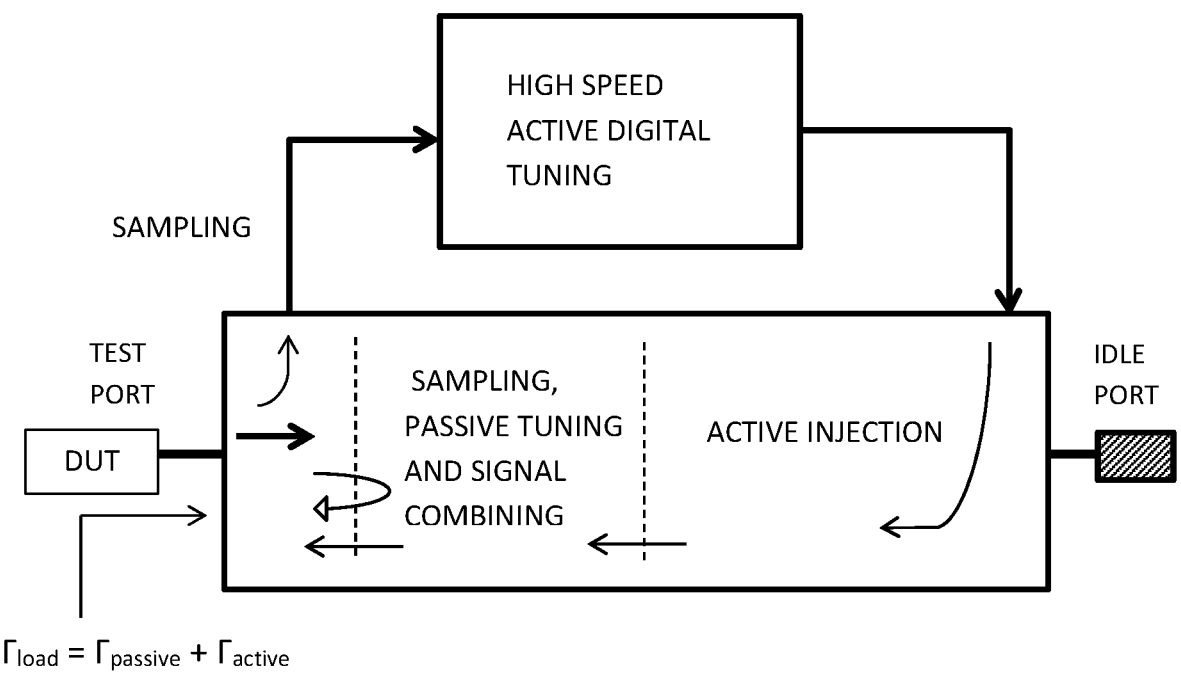
FIG. 3 depicts a second embodiment of the concept of the digital active/passive load pull tuner.
Figure 11:
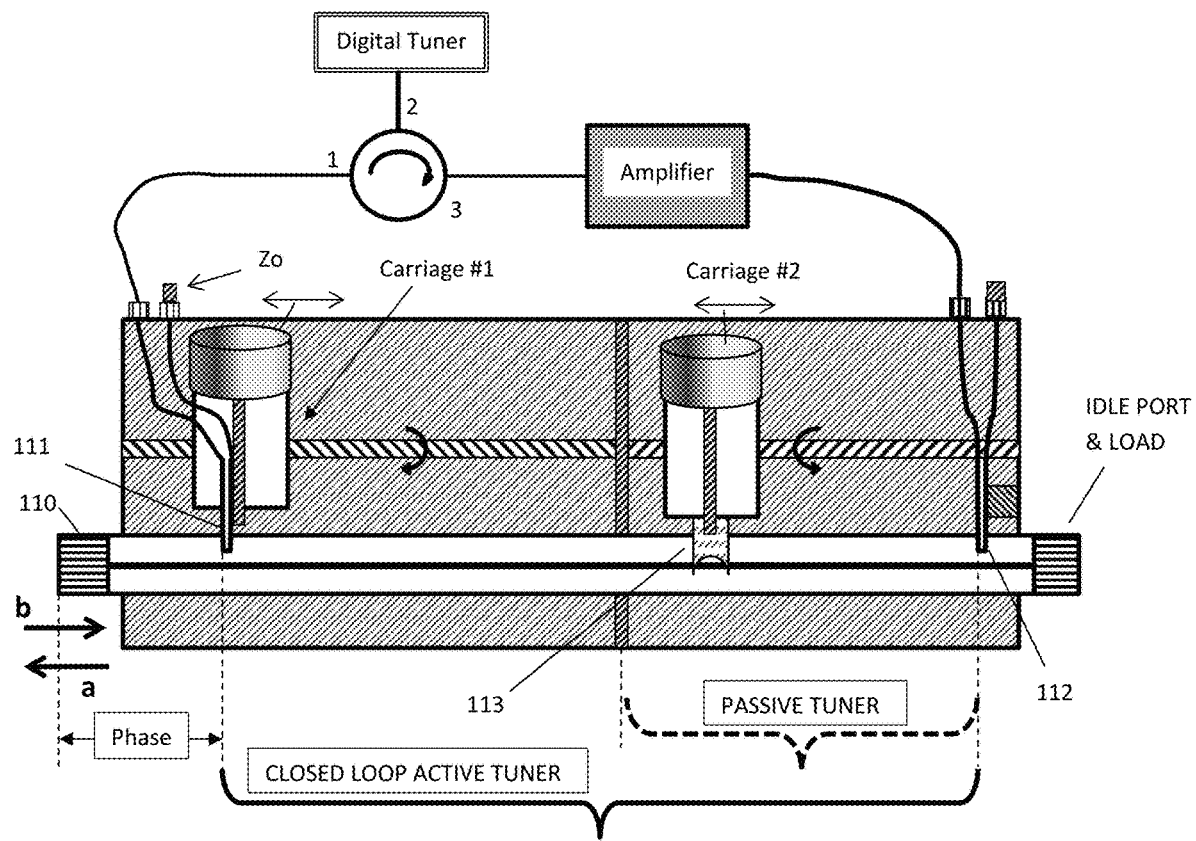
FIG. 11 depicts detailed scheme of second digital load pull tuner embodiment (see FIG. 3).

An alternative embodiment of the invention is shown in FIGS. 3 and 11; in this case the first coupler (111) is mounted permanently closest to the test port (110). The signal travelling through the circulator and the amplifier is injected back through the coupler (112). The phase between both couplers is adjusted as before by moving coupler (111). The result is the same, except in this case the insertion loss of the passive tuner interferes in the signal budget and must be more carefully adjusted. Other than that, the concept remains the same.

Figure 7B:
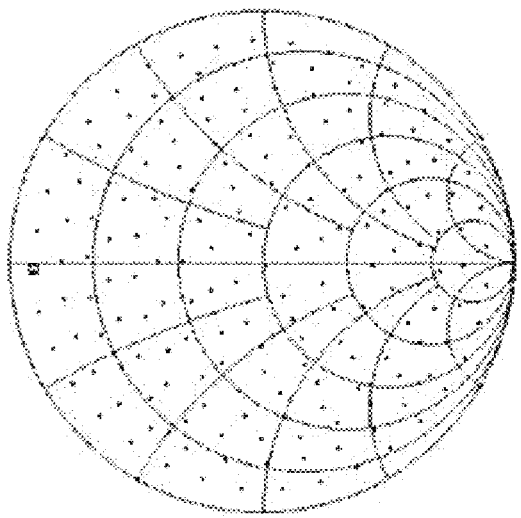

FIG. 7 shows typical tuning patterns of digital solid-state (FIG. 7A) and mechanical tuners (FIG. 7B). Mechanical tuning pattern is regular and reaches high $\Gamma$ at all phases, but mechanical movement is slow (tunes in seconds). Digital tuning pattern is irregular, does not reach high $\Gamma$ at all phases, but it is very fast (tunes in milli-seconds). The combination of both, in addition to the amplifier, that allows to compensate for losses, makes the solution unique.

Figure 9:
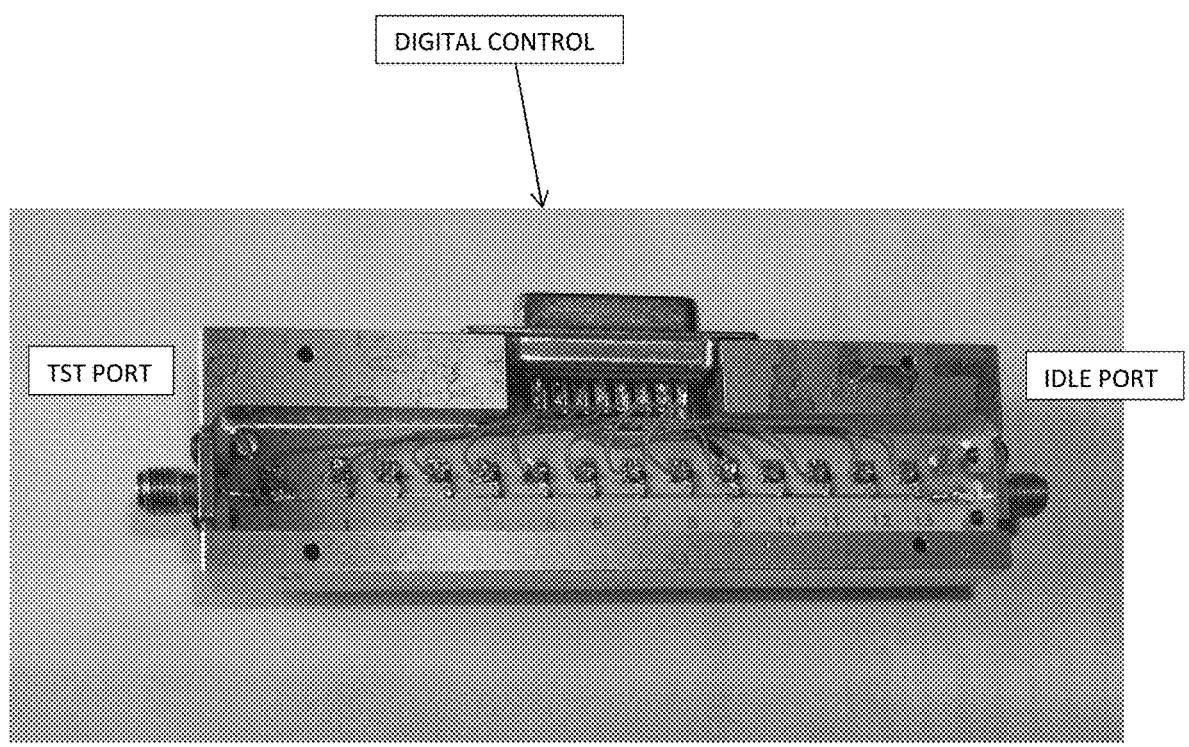
FIG. 9 depicts prior art, prototype of digital solid-state tuner using 12 PIN diodes.
Figure 10:
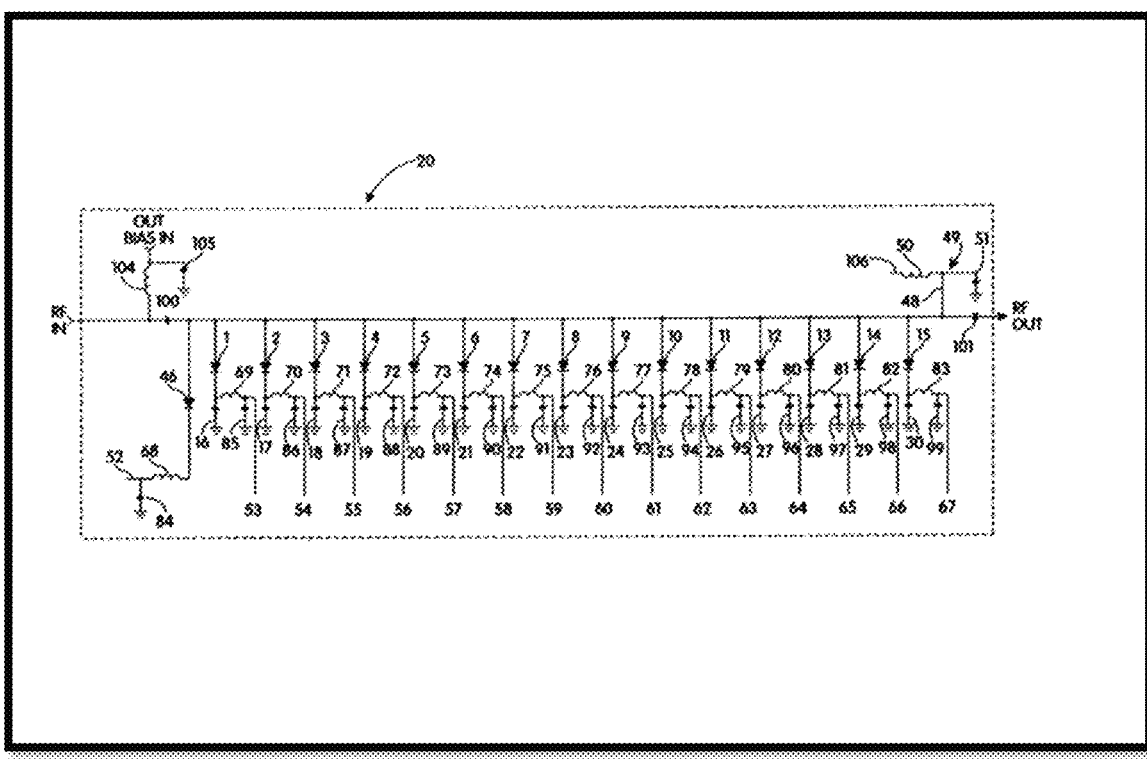
FIG. 10 depicts prior art, electrical diagram of digital solid-state tuner.

FIG. 9 is a photograph of a recently manufactured digital solid-state tuner, based on an invention of the early nineties (see ref. 4), shown in principle in FIG. 10. FIG. 11 shows an alternative embodiment of the tuner. In this case, seen from the test port (110), the passive tuner (113) follows directly after the sampling (111); the active injection (112) is closer to the idle port. In this case the feedback injected signal is attenuated by the passive tuner (113) but the injected signal is also power pre-matched to the output port of the DUT. The tuning mechanism and signal relations, shown in FIG. 6, remain essentially intact, only in practice the necessary remotely controlled carriage and probe settings will be different for any specific tuning requirement.

The adjustable directional coupler (51) uses the modified concept of a wave-probe (see ref. 3). The wave-probe uses a "U" formed electromagnetic loop, which is inserted vertically into the slabline slot (FIG. 12). When the vertical penetration and by that the distance between the bottom of the "U" loop and the center conductor of the slabline is changed this changes the amplitude of the coupling factor. Typical coupling values vary between −10 and −30 dB. When the coupling loop moves horizontally along the slabline this changes the phase of the coupling factor and thus the phase of the signal processed inside the closed active feedback loop. Both said coupling loop movements are ascertained by attaching the coupling loop on the vertical axis of a remotely controlled mobile carriage moving along the slabline (item 111 in FIG. 11). The key issue in a directional coupler is "directivity". This is the ratio (expressed in dB) between the signal power coupled into the coupled port (3) coming from the input port (1) to the signal power coupled into the coupled port coming from the inverse direction, i.e. the output port (2). This is shown in FIG. 13. Since the signal from the output port into the coupled port is smaller than the signal from the input port, the directivity is +X dB. In FIG. 13 the directivity is DIR=S31/S32=S31 (dB)−S32 (dB).

Figure 4:
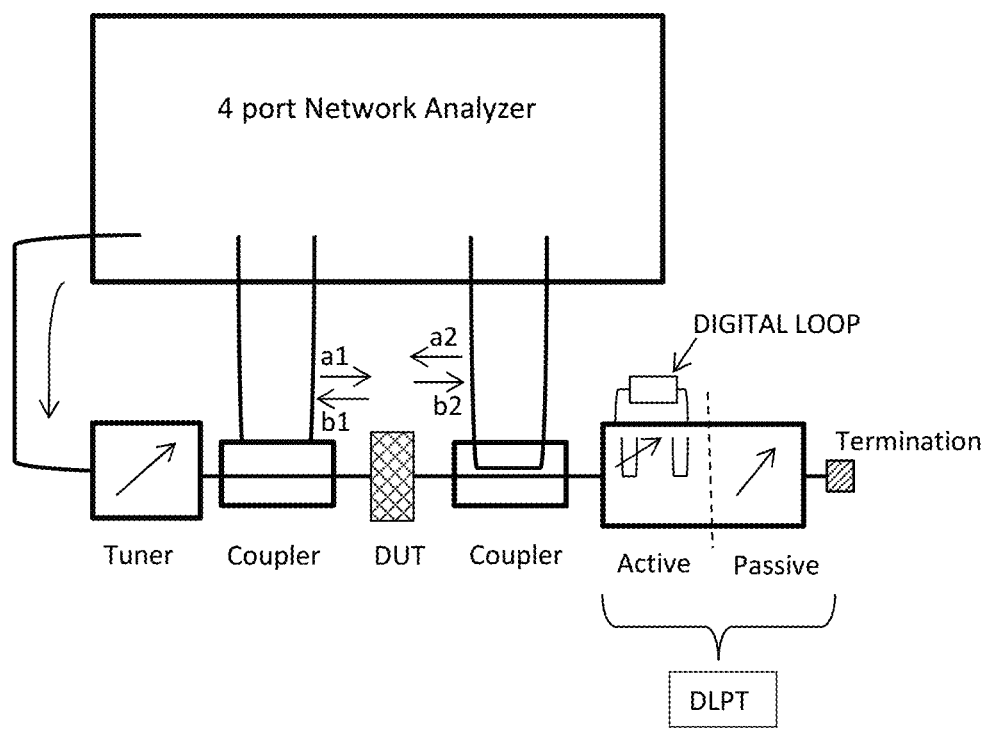
FIG. 4 depicts a vector load pull system for digital load pull tuner (DLPT).

An active tuner cannot be pre-calibrated, because the potential saturation of the amplifier in the active loop will distort and invalidate the calibration data. This is a tricky phenomenon, because it may happen at any time during measurement. That is a set of calibration data can be valid at one input power or impedance and invalid at another. For that reason any pre-calibration can only be used for pre-tuning while a vector load pull system (FIG. 4) must always be used, which allows "real-time" travelling wave <ai> and <bi> measurements and exact calculation of power and input and load impedance.

This application discloses the concept of pre-matched active digital load pull tuner (DLPT). Obvious alternatives shall not impede on the originality of the concept.

What is claimed is:

1. A closed loop hybrid (active & passive) load pull tuner, comprises:
   a digital, high-speed, active tuner and a passive pre-matching tuner as integrated parts of the closed loop,
   including:
     a slabline having a test port, an idle port, a center conductor, and
     two alongside the slabline sliding, remotely controlled, mobile carriages #1 and #2,
     an adjustable signal coupler,
     a circulator having, in signal flow, ports #1, #2 and #3,
     a remotely controlled high-speed digital electronic tuner having a test port and an idle port,
     an amplifier having an input port and an output port, and
     a fixed signal coupler,
     each said signal coupler having an input, an output, a coupled and an isolated port;
   wherein
     the coupled port of the adjustable coupler is connected with port #1 of the circulator,
     port #2 of the circulator is connected with the test port of the digital electronic tuner,
     port #3 of the circulator is connected with the input port of the amplifier,
     the output port of the amplifier is connected with the coupled port of the fixed coupler;
   and wherein
     the mobile carriage #1 is inserted between the test port of the slabline and the mobile carriage #2,
     the mobile carriage #2 is inserted between the mobile carriage #1 and the fixed coupler.

2. The closed loop hybrid load pull tuner of claim 1, wherein
   the adjustable signal coupler is attached to a remotely controlled vertical axis of the mobile carriage #1,
   a metallic tuning probe, capacitively coupled with the center conductor of the slabline is attached to a remotely controlled vertical axis of the mobile carriage #2.

3. The closed loop hybrid load pull tuner of claim 2, wherein
   the adjustable signal coupler comprises a U-formed sensor, insertable into a slot of the slabline and electro-magnetically coupled with the center conductor,
   and wherein
     one branch of the U-formed sensor is the coupled port and the other branch is the isolated port of the adjustable signal coupler.

4. The closed loop hybrid load pull tuner of claim 2, wherein the isolated ports of the signal couplers, the idle port of the slabline and the idle port of the high-speed digital electronic tuner are terminated with a matched load.

\* \* \* \* \*